United States Patent
Shi

(10) Patent No.: US 10,367,081 B2
(45) Date of Patent: Jul. 30, 2019

(54) METHOD OF MANUFACTURING THIN FILM TRANSISTOR

(71) Applicant: Shenzhen China Star Optoelectronics Technology Co., Ltd., Shenzhen, Guangdong (CN)

(72) Inventor: Longqiang Shi, Guangdong (CN)

(73) Assignee: Shenzhen China Star Optoelectronics Semiconductor Display Technology Co., Ltd., Shenzhen, Guangdong (CN)

(*) Notice: Subject to any disclaimer, the term of this patent is extended or adjusted under 35 U.S.C. 154(b) by 58 days.

(21) Appl. No.: 15/520,375

(22) PCT Filed: Apr. 6, 2017

(86) PCT No.: PCT/CN2017/079561
§ 371 (c)(1),
(2) Date: Apr. 19, 2017

(87) PCT Pub. No.: WO2018/149027
PCT Pub. Date: Aug. 23, 2018

(65) Prior Publication Data
US 2018/0301545 A1 Oct. 18, 2018

(30) Foreign Application Priority Data

Feb. 17, 2017 (CN) .......................... 2017 1 0087307

(51) Int. Cl.
*H01L 29/12* (2006.01)
*H01L 29/66* (2006.01)
(Continued)

(52) U.S. Cl.
CPC .. *H01L 29/66969* (2013.01); *H01L 21/02244* (2013.01); *H01L 21/02252* (2013.01);
(Continued)

(58) Field of Classification Search
CPC ............. H01L 29/786; H01L 29/78648; H01L 29/78696
See application file for complete search history.

(56) References Cited

U.S. PATENT DOCUMENTS

| | | |
|---|---|---|
| 2010/0044717 A1 | 2/2010 | Choi et al. |
| 2015/0011047 A1 | 1/2015 | Huang |

(Continued)

FOREIGN PATENT DOCUMENTS

| | | |
|---|---|---|
| CN | 102064109 A | 5/2011 |
| CN | 105097553 A | 11/2015 |
| CN | 105575819 A | 5/2016 |

*Primary Examiner* — Phuc T Dang
(74) *Attorney, Agent, or Firm* — Andrew C. Cheng

(57) ABSTRACT

The present disclosure provides a thin film transistor (TFT) and its manufacturing method. The method includes the following steps: sequentially depositing a buffer layer and a shielding layer on a substrate; forming an IGZO layer on and covering the shielding layer; processing the IGZO layer by annealing so that a portion of the IGZO layer is diffused by the buffer layer and has a conductor property; and forming a source and a drain so that the source and drain contact the portion of the IGZO layer. The present disclosure, through annealing the IGZO layer, the buffer layer makes portions of the IGZO layer contacting the source and the drain to have conductor property, thereby avoiding the prior art's complex process, simplifying the manufacturing of the IGZO TFT, and enhancing the production efficiency.

7 Claims, 3 Drawing Sheets

(51) Int. Cl.
  *H01L 21/02* (2006.01)
  *H01L 29/786* (2006.01)
  *H01L 21/477* (2006.01)
  *H01L 21/385* (2006.01)

(52) U.S. Cl.
  CPC .......... *H01L 21/385* (2013.01); *H01L 21/477* (2013.01); *H01L 29/7869* (2013.01); *H01L 29/78618* (2013.01); *H01L 29/78633* (2013.01); *H01L 21/02554* (2013.01); *H01L 21/02565* (2013.01); *H01L 21/02576* (2013.01); *H01L 21/02631* (2013.01)

(56) References Cited

U.S. PATENT DOCUMENTS

| | | | |
|---|---|---|---|
| 2015/0144942 A1* | 5/2015 | Yang | H01L 29/78696 257/43 |
| 2015/0249161 A1* | 9/2015 | Su | H01L 21/02565 257/43 |
| 2017/0141231 A1* | 5/2017 | Matsumoto | H01L 21/471 |
| 2018/0108780 A1* | 4/2018 | Li | H01L 21/02664 |
| 2018/0197973 A1 | 7/2018 | Deng | |

* cited by examiner

METHOD OF MANUFACTURING THIN FILM TRANSISTOR

BACKGROUND OF THE INVENTION

1. Field of the Invention

The present disclosure generally relates to display panel techniques, and particularly relates to a thin film transistor and its manufacturing method.

2. The Related Arts

A thin film transistor (TFT) is usually made of amorphous silicon. As the dimension of display devices continuously increases, amorphous silicon TFTs suffer a number of shortcomings such as insufficient mobility rate, low uniformity, and the consumption of pixel area, leading to low transmittance. To overcome these shortcomings, TFTs made of oxide semiconductor such as indium gallium zinc oxide (IGZO) are developed. To ensure that the source and drain of IGZO TFT to have good contact with IGZO, the interfaces between the IGZO and the source, drain, specialized processing has to be performed so as to maintain conductor property across the interfaces.

Existing techniques apply oxygen plasma treatment to the interfaces to achieve the required conductor property, but this is a complex and inefficient process.

SUMMARY OF THE INVENTION

The present disclosure provides a thin film transistor (TFT) and a manufacturing method of the TFT where the source and drain of the TFT have good contact with the IGZO layer without complex processing.

The TFT manufacturing method includes the following steps: sequentially depositing a buffer layer and a shielding layer on a substrate, where the buffer layer is a hydrogenated buffer layer; forming an indium gallium zinc oxide (IGZO) layer on and covering the shielding layer, where the IGZO layer comprises a first portion on a top side of the shielding layer and at least a second portion adjoining the first portion; processing the IGZO layer by annealing, where the buffer layer's hydrogen is diffused into the second portion, the second portion becomes doped IGZO and has a conductor property, and the first portion maintains a semiconductor property; and forming a source and a drain, where the source and drain contact the second portion of the IGZO layer. The step of forming the source and drain includes the following sub-steps: sequentially forming a dielectric layer, a gate layer, and a middle layer on the annealed IGZO layer; forming a via that runs through the dielectric layer and the middle layer, and connects the second portion; and forming the source and the drain by depositing a metal on the middle layer and in the via.

The present disclosure provides another TFT manufacturing method including the following steps. sequentially depositing a buffer layer and a shielding layer on a substrate; forming an IGZO layer on and covering the shielding layer; processing the IGZO layer by annealing so that a portion of the IGZO layer is diffused by the buffer layer and has a conductor property; and forming a source and a drain so that the source and drain contact the portion of the IGZO layer.

The TFT includes a buffer layer and a shielding layer sequentially deposited on a substrate; an IGZO layer on and covering the shielding layer, where a portion of the IGZO layer is diffused by the buffer layer and has a conductor property; and a source and a drain contacting the portion of the IGZO layer.

In contrast to the prior art, the present disclosure, through annealing the IGZO layer, the buffer layer makes portions of the IGZO layer contacting the source and the drain to have conductor property, thereby avoiding the prior art's complex process to achieve the same goal, simplifying the manufacturing of the IGZO TFT, and enhancing the production efficiency.

BRIEF DESCRIPTION OF THE DRAWINGS

To make the technical solution of the embodiments according to the present disclosure, a brief description of the drawings that are necessary for the illustration of the embodiments will be given as follows. Apparently, the drawings described below show only example embodiments of the present disclosure and for those having ordinary skills in the art, other drawings may be easily obtained from these drawings without paying any creative effort. In the drawings.

DETAILED DESCRIPTION OF THE PREFERRED EMBODIMENTS

In the following, the present disclosure is explained in details through embodiments and accompanying drawings. It should be understood that not all possible embodiments are disclosed. Other embodiments derived from the following embodiments by a reasonably skilled person in the art without significant inventive effort should be considered to be within the scope of the present disclosure.

Figure 1:
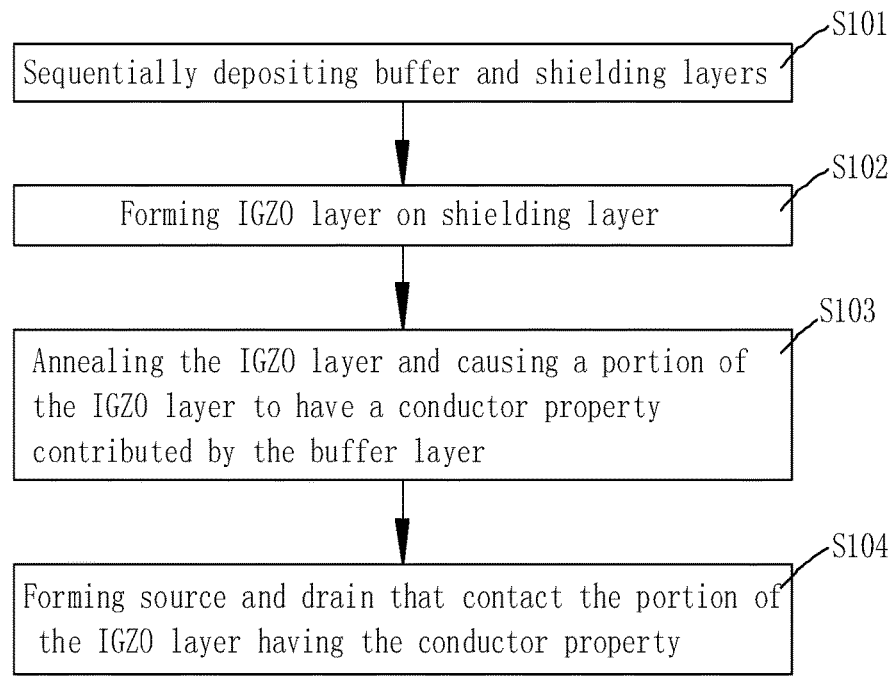
FIG. 1 is a flow diagram showing the steps of a thin film transistor (TFT) manufacturing method according to a first embodiment of the present disclosure.
Figure 2:
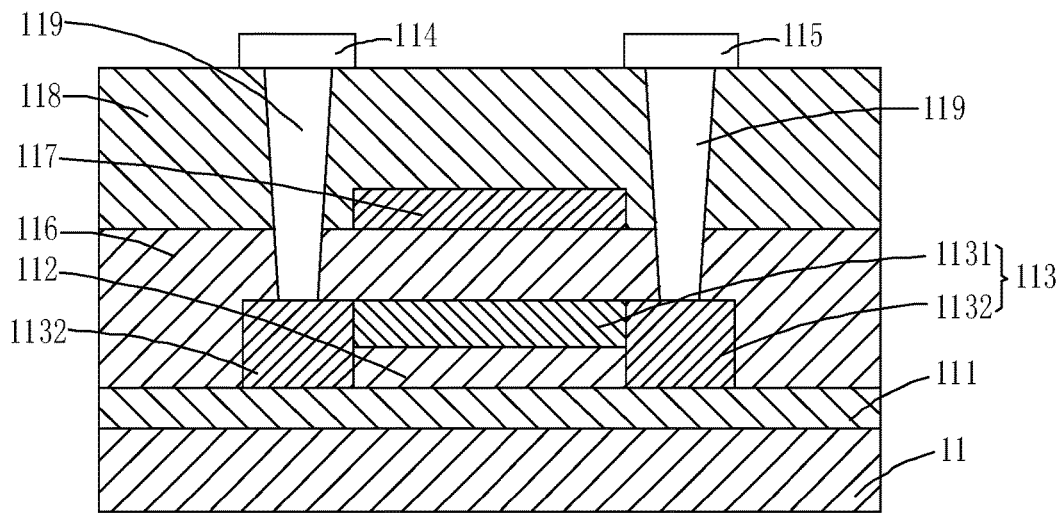
FIG. 2 is a schematic sectional diagram showing a TFT formed by the method of FIG. 1.

As illustrated in FIGS. 1 and 2, a thin film transistor (TFT) manufacturing method according to a first embodiment of the present disclosure includes the following steps.

In step S101, a buffer layer 111 and a shielding layer 112 are deposited sequentially on a substrate 11.

Specifically, plasma enhanced chemical vapor deposition (PECVD) is applied to obtain hydrogenated silicon nitride as a hydrogenated buffer layer 111 from hydrogen azide and silicon hydride.

Then, the shielding layer 112 is formed using physical vapor deposition (PVD). In the present embodiment, the shielding layer 112 is an insulating shielding layer.

In step S102, an indium gallium zinc oxide (IGZO) layer 113 is formed on and covers the shielding layer 112.

IGZO is an N-type semiconductor material formed from $In_2O_3$, $Ga_2O_3$, and ZnO. In this step, a patterned IGZO layer 113 is obtained to cover the shielding layer 112 through PVD or pulsed laser deposition (PLD) and subsequent exposure, development, etching, and stripping processes.

The IGZO layer 113 includes a first portion 1131 on a top side of the shielding layer 112, and at least a second portion 1132 adjoining the first portion 1131. In the present embodiment, there are two second portions 1132, each adjoining the first portion 1131 from one of its lateral sides.

In step S103, the IGZO layer 113 is processed by annealing. In this process, the buffer layer 111 leads to that a portion of the IGZO layer 113 has conductor property.

Specifically, the buffer layer 111 of the present embodiment is a hydrogenated buffer layer. In the annealing process, the hydrogen in the hydrogenated buffer 111 is diffused into the IGZO layer 113 under the annealing's high temperature. A portion of the IGZO layer 113 is, therefore, doped and has conductor property. In this process, due to the presence of the shielding layer 112, the first portion 1131 protected by the shielding layer 112 is not affected and still has semiconductor property. The second portions 1132, without the protection of the shielding layer 112, become doped and have conductor property.

The doped IGZO is an N-type heavily doped IGZO.

In step S104, a source 114 and a drain 115 are formed and contact with the portion of the IGZO layer 113 having conductor property.

Figure 3:
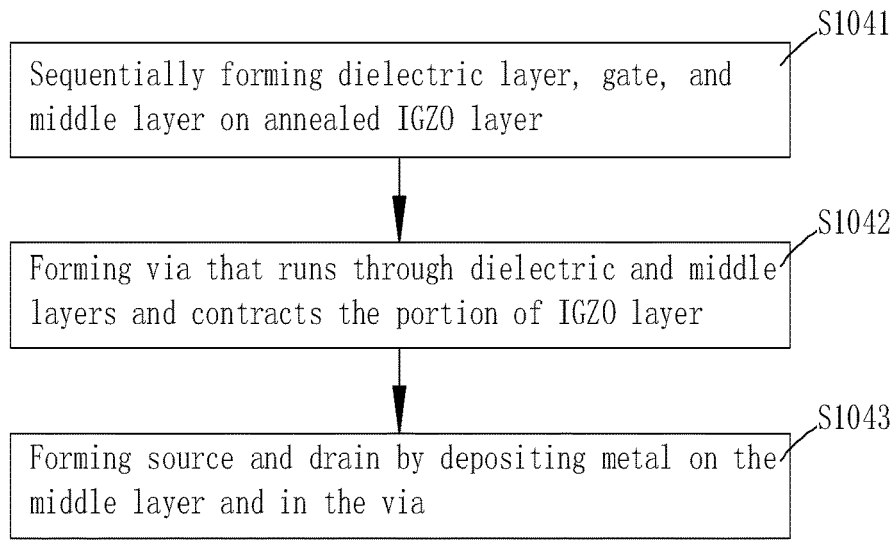
FIG. 3 is a flow diagram showing the sub-steps of the step S104 of the method of FIG. 1.

As shown in FIGS. 2 and 3, the step S104 includes the following sub-steps.

In sub-step S1041, a dielectric layer 116, a gate layer 117, and a middle layer 118 are sequentially formed on the annealed IGZO layer 113.

Specifically, a method including but not limited to chemical vapor deposition (CVD) is conducted on the annealed IGZO layer 113 to form a first silica layer, which is the dielectric layer 116. The dielectric layer 116 isolates the IGZO layer 113 from the influence of external oxygen or water molecules, and helps to enhance the reliability of the IGZO layer 113.

Then, a method such as PVD is applied to deposit a metal on the dielectric layer 116, and subsequently exposure, development, etching, and stripping are conducted to form the patterned gate layer 117.

Finally, a method such as CVD is applied to form a second silica layer on the gate layer 117. The second silica layer is the middle layer 118, which is insulating and therefore provides insulation protection to the gate layer 117.

In sub-step S1042, for each second portion 1132, a via 119 is formed running through the dielectric layer 116 and the middle layer 118, and connecting the second portion 1132.

Specifically, the vias 119 are formed through coating photoresist, exposure, and dry-etching.

In the present embodiment, there are two vias 119, each connecting one of the second portions 1132 at the lateral sides of the first portion 1131.

In sub-step S1043, the source 114 and the drain 115 are formed by depositing a metal on the middle layer 118 and in the vias 119.

Specifically, PVD is used to deposit the metal in the vias 119 and on the middle layer 118 to form a metal layer. Then, a photoresist layer is deposited on the metal layer, and subsequently processed by exposure, development, etching, and stripping, so that the patterned source 114 and drain 115 are obtained. Since each via 119 is connected to one of the second portions 1132, the source 114 and the drain 115 are connected to the second portions 1132.

Figure 4:
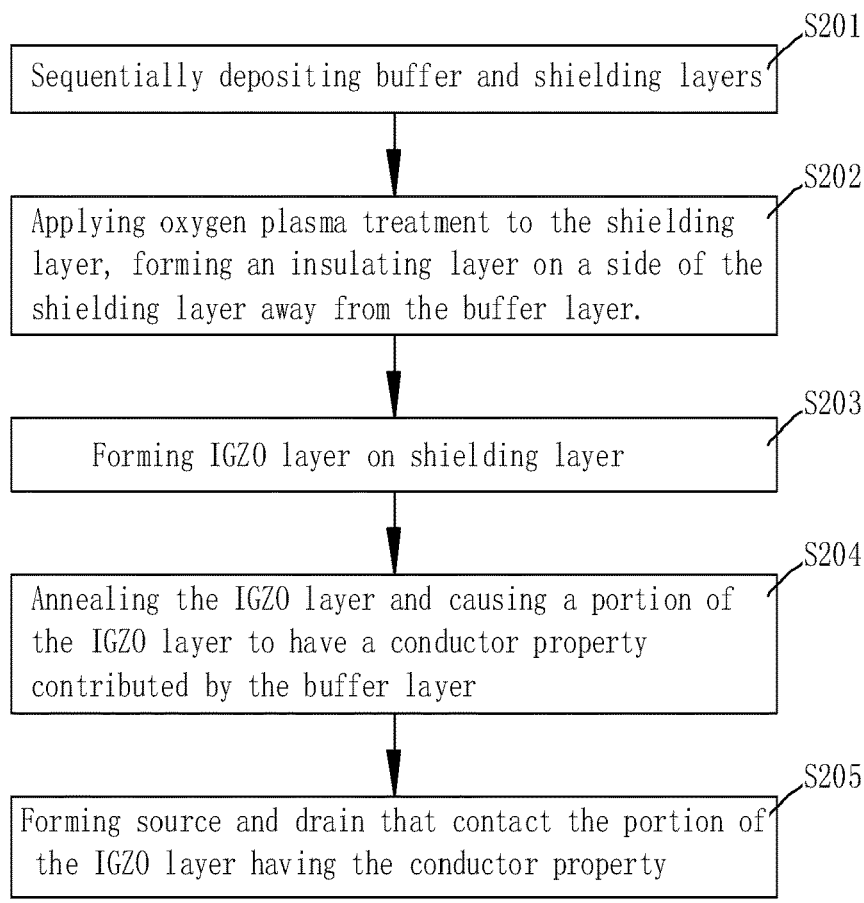
FIG. 4 is a flow diagram showing the steps of a TFT manufacturing method according to a second embodiment of the present disclosure.
Figure 5:
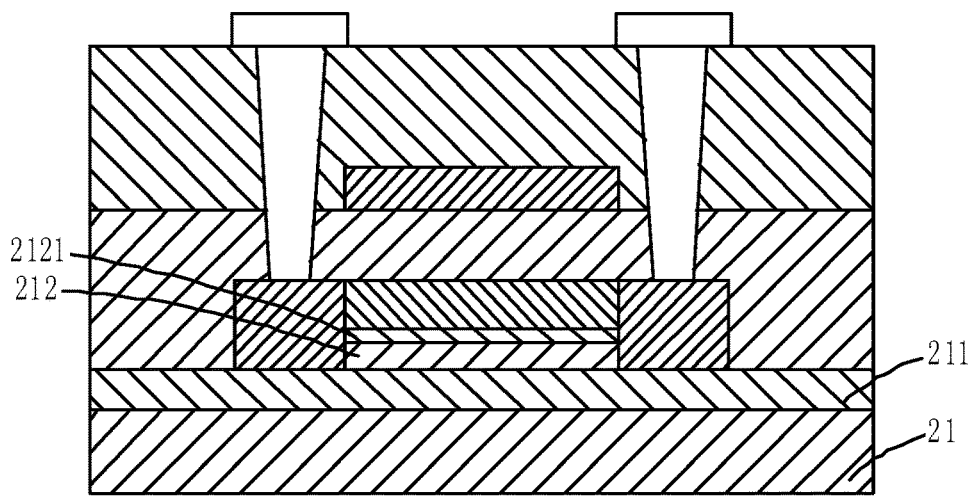
FIG. 5 is a schematic sectional diagram showing a TFT formed by the method of FIG. 4.

As shown in FIGS. 4 and 5, a thin film transistor (TFT) manufacturing method according to a second embodiment of the present disclosure includes steps S203, S204, and S205 identical to the steps S102, S103, and S104. The related details are therefore omitted. The present embodiment includes the other steps as follows.

In step S201, a buffer layer 211 and a shielding layer 212 are deposited sequentially on a substrate 21.

The buffer layer 211 is formed using a same process as that of the previous embodiment. In the present embodiment, the shielding layer 212 is a metallic shielding layer.

Specifically, molybdenum or aluminum is used as material and deposited by PVD. The patterned metallic shielding layer 212 is then obtained through exposure, development, etching, and stripping.

In step S202, oxygen plasma treatment is applied to the metallic shielding layer 212, forming an insulating layer 2121 on a side of the metallic shielding layer 212 away from the buffer layer 211.

Specifically, when the metallic shielding layer 212 is made of aluminum, aluminum oxide is formed on the metallic shielding layer 212 after oxygen plasma treatment, and solid-state aluminum oxide has insulator property, thereby functioning as the insulating layer 2121.

Figure 6:
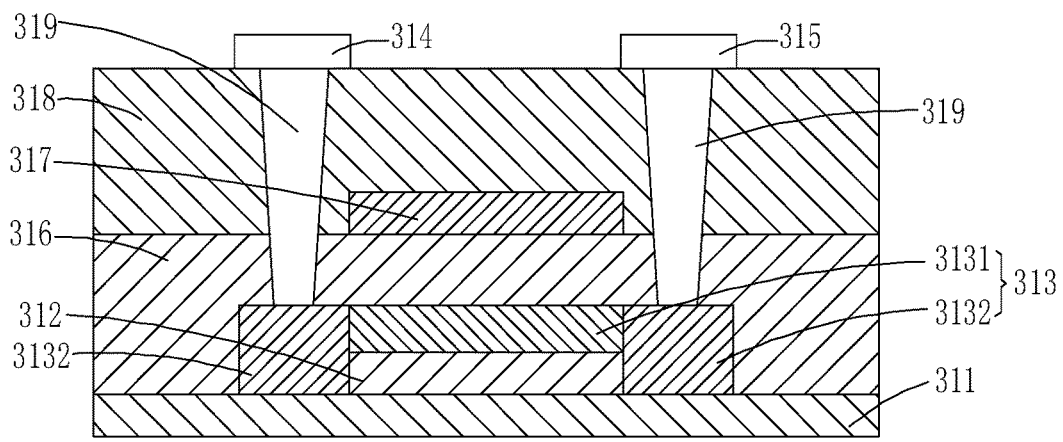
FIG. 6 is a schematic sectional diagram showing a TFT according to a first embodiment of the present disclosure.

As shown in FIG. 6, a TFT according to a first embodiment of the present disclosure includes a buffer layer 311, a shielding layer 312, an IGZO layer 313, a source 314, and a drain 315, sequentially deposited in this order. On the IGZO layer 313, a dielectric layer 316, a gate 317, and a middle layer 318 are sequentially formed.

To form the buffer layer 311, PECVD is applied to obtain hydrogenated silicon nitride from hydrogen azide and silicon hydride. The buffer layer 311, therefore, is a hydrogenated buffer layer.

The shielding layer 312 is an insulating shielding layer.

The IGZO layer 313 is an N-type semiconductor and includes a first portion 3131 corresponding to the shielding layer 312, and second portions 3132, each adjoining the first portion 3131 from one of its lateral sides.

The IGZO layer 313 is annealed and, in the annealing process, the hydrogen in the hydrogenated buffer 311 is diffused into the IGZO layer 313 under the annealing's high temperature. A portion of the IGZO layer 313 is, therefore, doped and has conductor property. In this process, due to the presence of the shielding layer 312, the first portion 3131 protected by the shielding layer 312 is not affected and still has semiconductor property. The second portions 3132, without the protection of the shielding layer 312, become doped and have conductor property.

The dielectric layer 316, the gate 317, and the middle layer 318 are sequentially formed on the IGZO layer 313. Their formation has already been described and the details are omitted here.

In addition, there are two vias 319, each running through the dielectric layer 316 and the middle layer 318, and connecting one of the second portions 3132.

The source 314 and the drain 315 are formed by forming a metal layer through depositing a metal in the vias 319 and on the middle layer 318, depositing a photoresist layer on the metal layer, and conducting exposure, development, etching, and stripping. The source 314 and the drain 315 are connected to the second portions 1132.

Figure 7:
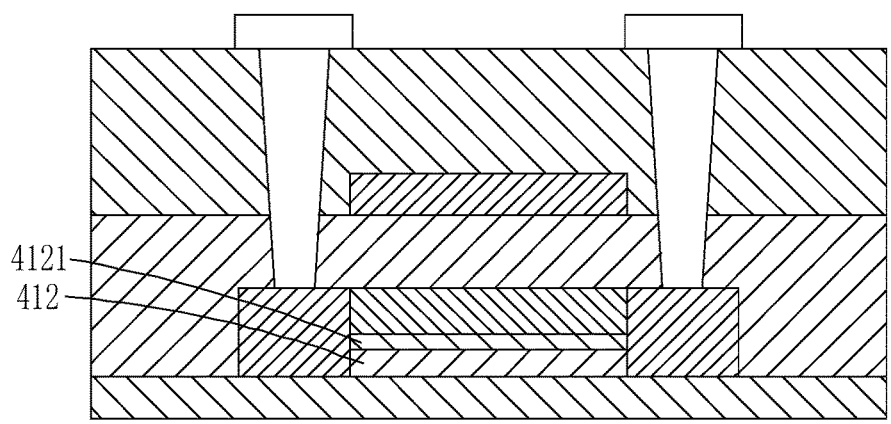
FIG. 7 is a schematic sectional diagram showing a TFT according to a second embodiment of the present disclosure.

As shown in FIG. 7, a TFT according to a second embodiment of the present disclosure further includes an insulating layer 4121.

When the shielding layer 412 is a metallic shielding layer, oxygen plasma treatment is applied and an insulating layer 4121 is formed on a side the metallic shielding layer 412 away from the buffer layer 411.

The other elements of the present embodiment and their formations are identical to the previous embodiment, and their details are omitted.

In contrast to the prior art, the present disclosure, through annealing the IGZO layer, the buffer layer makes portions of the IGZO layer contacting the source and the drain to have conductor property, thereby avoiding the prior art's complex process to achieve the same goal, simplifying the manufacturing of the IGZO TFT, and enhancing the production efficiency.

Embodiments of the present disclosure have been described, but not intending to impose any unduly constraint to the appended claims. Any modification of equivalent structure or equivalent process made according to the disclosure and drawings of the present disclosure, or any application thereof, directly or indirectly, to other related fields of technique, is considered encompassed in the scope of protection defined by the claims of the present disclosure.

What is claimed is:

1. A method of manufacturing a thin film transistor, comprising
    sequentially depositing a buffer layer and a shielding layer on a substrate, where the buffer layer is a hydrogenated buffer layer;
    forming an indium gallium zinc oxide (IGZO) layer on and covering the shielding layer, where the IGZO layer comprises a first portion on a top side of the shielding layer and at least a second portion adjoining the first portion;
    processing the IGZO layer by annealing, where the buffer layer's hydrogen is diffused into the second portion, the second portion becomes doped IGZO and has a conductor property, and the first portion maintains a semiconductor property; and
    forming a source and a drain, where the source and drain contact the second portion of the IGZO layer;
    wherein the step of forming the source and drain comprises the sub-steps of;
    sequentially forming a dielectric layer, a gate layer, and a middle layer on the annealed IGZO layer;
    forming a via that runs through the dielectric layer and the middle layer, and connects the second portion; and
    forming the source and the drain by depositing a metal on the middle layer and in the via.

2. The method as claimed in claim 1, wherein the shielding layer is a metallic shielding layer; and the method further comprises a step, before forming the IGZO layer, of applying oxygen plasma treatment to the shielding layer, forming an insulating layer on a side of the shielding layer away from the buffer layer.

3. A method of manufacturing a thin film transistor, comprising
    sequentially depositing a buffer layer and a shielding layer on a substrate;
    forming an IGZO layer on and covering the shielding layer;
    processing the IGZO layer by annealing so that a portion of the IGZO layer is diffused by the buffer layer and has a conductor property; and
    forming a source and a drain so that the source and drain contact the portion of the IGZO layer;
    wherein the IGZO layer comprises a first portion on a top side of the shielding layer and at least a second portion adjoining the first portion; and the portion of the IGZO layer having the conductor property is the second portion.

4. The method as claimed in claim 3, wherein the buffer layer is a hydrogenated buffer layer; the buffer layer's hydrogen is diffused into the second portion during annealing; and the second portion becomes doped IGZO and has the conductor property.

5. The method as claimed in claim 4, wherein the first portion maintains a semiconductor property after annealing.

6. The method as claimed in claim 3, wherein the step of forming the source and drain comprises the sub-steps of;
    sequentially forming a dielectric layer, a gate layer, and a middle layer on the annealed IGZO layer;
    forming a via that runs through the dielectric layer and the middle layer, and connects the second portion; and
    forming the source and the drain by depositing a metal on the middle layer and in the via.

7. The method as claimed in claim 3, wherein the shielding layer is a metallic shielding layer; and the method further comprises a step, before forming the IGZO layer, of applying oxygen plasma treatment to the shielding layer, forming an insulating layer on a side of the shielding layer away from the buffer layer.

* * * * *